United States Patent [19]

Hargis

[11] 4,156,204
[45] May 22, 1979

[54] VOLTAGE CONTROLLED OSCILLATOR WITH FREQUENCY AND PHASE CONTROL LOOP

[75] Inventor: Robert N. Hargis, Wheaton, Ill.

[73] Assignee: Motorola, Inc., Schaumburg, Ill.

[21] Appl. No.: 692,697

[22] Filed: Jun. 3, 1976

[51] Int. Cl.² .................................................. H03B 3/04
[52] U.S. Cl. .......................................... 331/12; 331/25
[58] Field of Search ........................................ 331/10–12, 331/18, 25; 329/122, 124

[56] References Cited

U.S. PATENT DOCUMENTS

| 2,731,566 | 1/1956 | Chalhoub | 331/12 |
| 3,456,196 | 7/1969 | Schneider | 331/12 X |

Primary Examiner—Siegfried H. Grimm

Attorney, Agent, or Firm—Victor Myer; James W. Gillman

[57] ABSTRACT

The inventive synchronization circuit accepts a reference input signal and produces a signal which is in both phase and frequency lock therewith. The reference signal is quadrature detected via a voltage controlled oscillator signal, a quadrature phase shifter and a pair of mixers. A frequency error signal is generated by processing the mixer outputs through a phase detector and integrator. A phase error signal is produced by extracting and combining the DC components of the signals at the mixer outputs. The frequency and phase error signals are summed to produce a control signal which is fed back to the voltage controlled oscillator, thus causing the oscillator signal to tend to lock in frequency and phase with the input reference signal.

7 Claims, 3 Drawing Figures

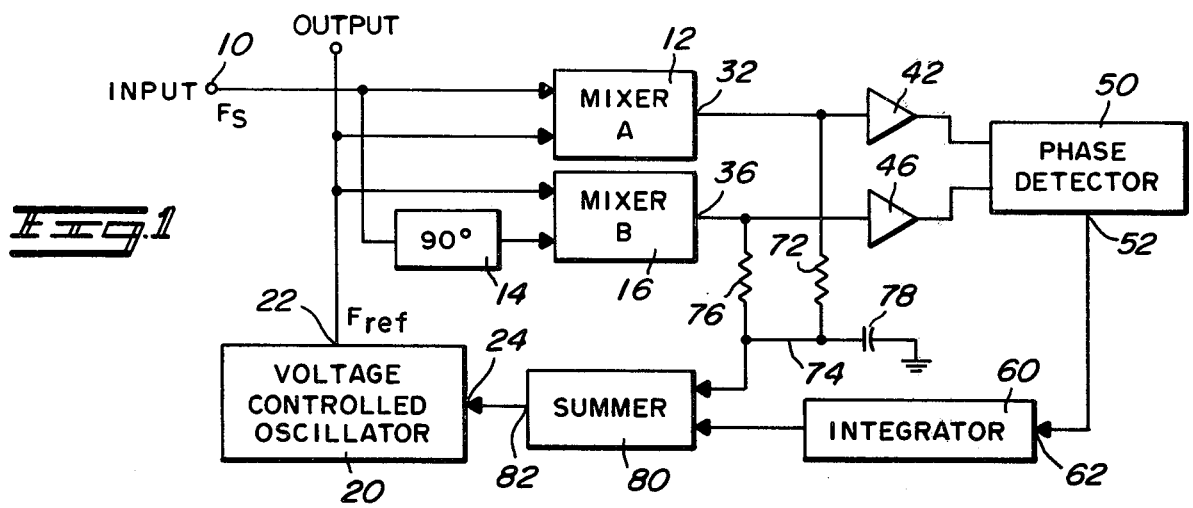
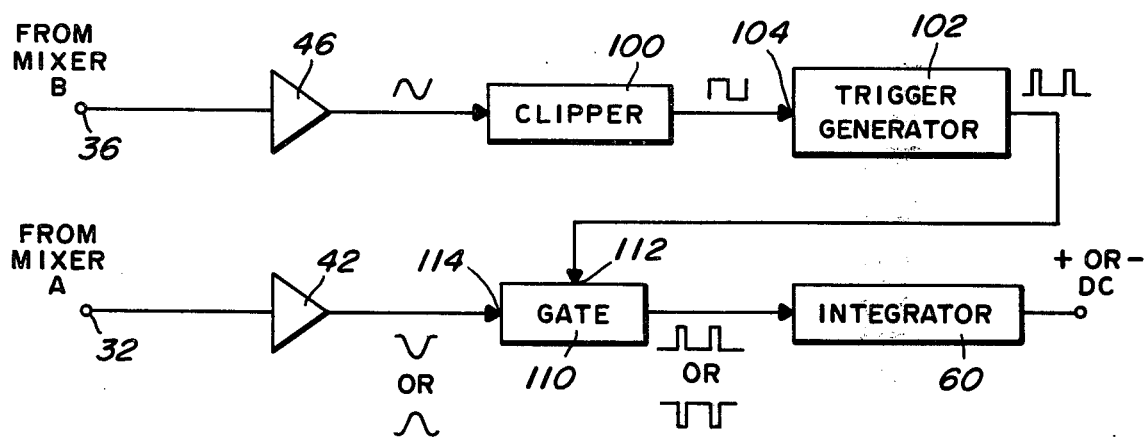
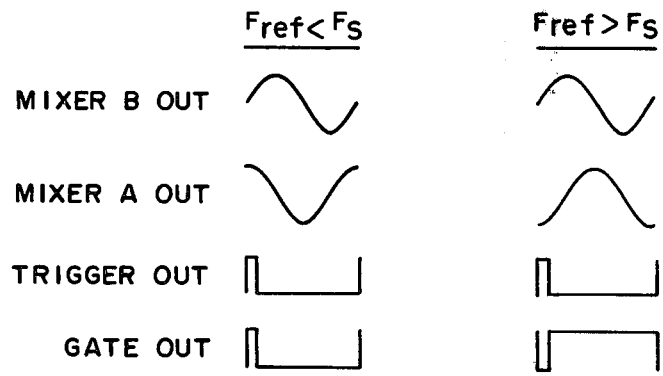

4,156,204

VOLTAGE CONTROLLED OSCILLATOR WITH FREQUENCY AND PHASE CONTROL LOOP

BACKGROUND OF THE INVENTION

The present invention relates to the signal processing art and, more particularly, to a means for producing a signal which is frequency and phase locked to an input signal.

Systems which frequency of phase lock to a reference input signal are well known, especially in the communications art. Frequency lock systems are commonly employed in tone detect systems which detect for the presence of an audible tone in an input noisy signal. Such systems lock to the frequency of the input tone thus producing an output that is at the same frequency of the tone but which is relatively noise free. Phase lock systems are commonly employed in communication decoding or demodulating schemes. There, for example, a signal in phase lock with a carrier of an input RF signal is created. The recreated carrier may then be used for decoding or demodulting the information signal on the RF signal.

Frequency lock schemes do not necessarily provide phase lock, and a phase lock scheme might not always produce frequency lock, i.e. it might lock an harmonic to the fundamental frequency. In applications wherein both frequency and phase lock are required, the prior art has used an IF discriminator in combination with an IF phase detector. Here, the input RF signal is heterodyned to an IF frequency and passed through a fixed IF filter. The output from the filter feeds to the IF discriminator and IF phase detector which sense frequency and phase change and generate error correction signals. Such IF discriminator phase and frequency lock systems are subject to thermal drift, as well as being expensive and bulky to manufacture.

SUMMARY OF THE INVENTION

It is an object of this invention, therefore, to provide an improved frequency and phase lock system.

It is a further object of this invention to provide an improved frequency and phase lock system which does not require IF signal processing.

Briefly, according to the invention, the synchronization system is capable of receiving an input signal and producing a signal which is in phase and frequency lock therewith. The system employs a signal controlled oscillator which has a control signal input and an output. The signal controlled oscillator responds to signals at its control signal input to vary the frequency of an oscillator signal at its output. A first mixer mixes the input signal with the oscillator signal. A phase shifter phase shifts either the input signal or the oscillator signal by a predetermined phase angle, preferably 90°. A second mixer mixes either the phase shifted input signal or the oscillator signal with the oscillator signal or the input signal, respectively. A frequency error detector couples to the outputs of the first and second mixers and produces a first error signal which is representative of the frequency difference between the input signal and the oscillator signal. Also coupled to the outputs of the first and second mixers is a phase error detector which generates a second error signal representative of the phase difference between the input signal and the oscillator signal. A control signal generator processes the first and second error signals and produces a control signal which is applied to the signal controlled oscillator control input. The control signal varies the frequency of the oscillator signal whereby the oscillator tends to phase and frequency lock with the input signal.

BRIEF DESCRIPTION OF THE DRAWINGS

FIG. 1 illustrates the preferred embodiment of the synchronization system in block diagram form;

FIG. 2 illustrates a preferred embodiment of the phase detector block illustrated in FIG. 1; and FIG. 3 is a series of waveforms illustrating the operation of the phase detector shown in FIG. 2.

DESCRIPTION OF THE PREFERRED EMBODIMENT OF THE INVENTION

Referring to FIG. 1, a radio frequency (RF) signal $F_s$ is received at the input terminal 10 of the synchronization system. The input signal $F_s$ is applied to one input of first mixer, mixer A 12. Input signal $F_s$ is also phase shifted 90° by a phase shifter 14 and applied to one input of the second mixer, mixer B 16. Applied to the remaining input of both mixer A 12 and mixer B 16 is an oscillator signal $F_{osc}$ which is generated at the output 22 of a voltage controlled oscillator 20. The voltage controlled oscillator 20 responds to control signals at its control input 24 to predeterminedly vary the frequency of the oscillator signal at its output 22.

Mixer A 12 and mixer B 16 operate in the known manner to produce sum and difference frequencies at their output terminals 32, 36 respectively. Preferably, mixers 12, 16 are comprised of conventional detector diodes, with the diodes in mixer A 12 oriented in the opposite polarity from those in mixer B 16.

The outputs 32, 36 of mixer A 12 and mixer B 16 are amplified in amplifiers 42, 46 respectively and applied to the inputs of a phase detector 50. The phase detector 50, which is discussed more fully with respect to FIGS. 2 and 3, produces an output signal, at its output terminal 52, which is of either a positive or negative polarity dependent upon the relative phasing of the input signals. The phase detector output 52 couples to the input 62 of an integrator 60 which, in turn, integrates the positive or minus polarity signal from the phase detector 50 and produces a DC frequency error signal. Thus, phase detector 50 and integrator 60 combine to form a frequency error detector which produces a DC output signal predeterminedly related to the frequency difference between the input signal and the oscillator signal at the output 22 of the voltage controlled oscillator 20.

Connected to the output 32 of mixer A 12, and the output 36 of mixer B 16 are series resistors 72, 76 respectively which connect at a common point 74, and thereat through a filter capacitor 78 to reference, or ground potential. The resistors 72, 76 and capacitor 78, in combination with the mixers, act as a phase error detector to produce an output DC phase error signal at terminal 74.

The frequency error signal from integrator 60, and the phase error signal at node 74 couple to the first and second inputs of a summer circuit 80. The summer 80 algebraically sums the DC error voltages at its inputs, and produces a predetermined control signal at its output 82. The control signal at the summer output 82 is fed back to the control input terminal 24 of the voltage controlled oscillator 20.

Operation of the synchronization system may be understood as follows. The output signals at output terminals 32, 36 of mixer A 12 and mixer B 16 contain beat frequencies representative of the frequency difference between the two input signals $F_s$ and $F_{osc}$. These output signals are amplified through the amplifiers 42, 46 and applied to the phase detector 50. Phase detector 50 generates an output signal which is of a polarity indicative of the relative phase between its two input signals. The detector output signal is integrated by integrator 60 which produces a DC frequency error signal, which signal is in turn applied to the summer, or control signal generator 80. The summer 80 responds to the signal by producing a control signal at its output 82 which, when fed to the control input 24 of the voltage controlled oscillator 20 tends to cause the oscillator signal $F_{osc}$ at output 22 to be in frequency synchronization with the input signal $F_s$.

When the frequency of $F_s$ is the same as the oscillator signal $F_{osc}$, the resistors 72, 76 and capacitor 78 perform a phase detector function. Since the detector diodes of the mixers A 12, and B 16 are of opposite polarity, the DC components of the outputs from the mixers are at a minimum when the input signal $F_s$ and the oscillator signal $F_{osc}$ are at the same phase angle. However, when the two signals $F_s$ and $F_{osc}$ are out of phase, the DC value at node 74 changes polarity and magnitude to indicate the relative phase differences.

The DC error signals produced from the integrator 60 and the phase detector at node 74 are summed in summer 80 whereby the signal applied at the control input 24 of the voltage controlled oscillator 20 causes the voltage controlled oscillator to both frequency and phase lock with the input signal $F_s$.

FIG. 2 illustrates a preferred embodiment of the phase detector 50 illustrated in FIG. 1. The output 36 from mixer B 16 is amplified through an amplifier 46 and applied to a clipper 100. Clipper 100 squares the input sine wave, and produces a resulting square wave at the input 104 of a trigger generator 102. Trigger generator 102 produces a defined pulse at its output, which defined pulse is synchronous to positive transitions of the square wave at the trigger generator 104. These pulses are applied to one input 112 of a gate circuit 110.

Applied to the remaining input 114 of the gate circuit 110 is the output 32 from mixer A 12 which is amplified by amplifier 42. The gate 110 produces either a positive or negative output pulse dependent on whether the output from the mixer A 12 is positive or negative synchronous to the occurrence of a defined pulse from the trigger generator 102.

This is more clearly understood with reference to FIG. 3. There, for $F_{osc}$ less than $F_s$ the mixer B output generates a defined trigger pulse when the mixer A output is positive. Thus the gate output is a positive pulse.

When $F_{osc}$ is greater than $F_s$ the mixer B output generates a defined trigger pulse when the mixer A output is negative, whereby the gate output signal is negative.

The integrator 60 operates in the known manner to integrate the positive or negative pulses thus producing a positive or negative error signal.

In summary, a synchronization system has been described which, without the use of an intermediate filter and discriminator, produces a signal which is in both frequency and phase lock with an input signal.

While a preferred embodiment of the invention has been described, it should be apparent that many modifications and variations thereto are possible, all of which fall within the true spirit and scope of the invention.

For example, while the preferred embodiment of the invention illustrates phase shifting the input signal by 90°, it should be understood that an angle other than 90° could be used or that the phase shift could be provided not at the input signal, but at the voltage controlled oscillator produced signal.

I claim:

1. A synchronization system for receiving an input signal and producing a signal in phase and frequency lock therewith, comprising:
   a signal controlled oscillator means, having a control signal input and an output, for producing an oscillator signal at its output, the oscillator signal having a frequency responsive to control signals at the control input;
   a first mixer means for mixing the input signal with the oscillator signal;
   phase shifter means for phase shifting one of the input signals and the oscillator signals by a predetermined phase angle;
   a second mixer means for mixing said one of the phase shifted input signals and the oscillator signals with the other one of said oscillator signals and said input signals, respectively;
   frequency error detector means, coupled to the outputs of the first and second mixer means, for producing a first error signal representative of the frequency difference between the input signal and the oscillator signal;
   phase error detector means, coupled to the outputs of the first and second mixer means, for producing a second error signal representative of the phase difference between the input signal and the oscillator signal;
   control signal generator means for processing the first and second error signals and producing a predetermined control signal at the signal controlled oscillator control input,
   whereby the oscillator signal tends to phase and frequency lock with the input signal.

2. The synchronization system of claim 1 wherein the phase shifter means phase shifts one of the input signals and the oscillator signals such that the relative phase relationship therebetween is 90°.

3. The synchronization system of claim 1 wherein the frequency error detector means comprises:
   a phase detector for processing the outputs from the first and second mixer means and producing either a positive or a negative output signal representative of the relative phasing thereof, and
   an integrator means for processing the phase detector output and producing a DC signal which is predeterminedly related to the frequency difference between the input signal and the signal controlled oscillator signal.

4. The synchronization system of claim 1 wherein the phase detector comprises filter means for extracting and predeterminedly combining the DC components from the signals at the first and second mixer outputs and producing a resultant DC phase error voltage.

5. The synchronization system of claim 3 wherein the phase detector comprises filter means for extracting and predeterminedly combining the DC components from the signals at the first and second mixer outputs and producing a resultant DC phase error voltage.

6. The synchronization system of claim 5 wherein the control signal generator means comprises summer means for predeterminedly summing the DC voltages produced by the phase error and frequency error detector means, thereby producing the control signal.

7. The synchronization system of claim 1 wherein the frequency error detector means comprises:

a trigger generator for producing defined trigger pulses at selected transitions of the output signal from one of the mixer means; and gate means for producing either a positive or a negative output signal dependent on whether the output from the other mixer is positive or minus at the time of the produced trigger signals.

* * * * *